(12) United States Patent
Han et al.

(10) Patent No.: US 7,174,496 B2
(45) Date of Patent: Feb. 6, 2007

(54) ERROR CORRECTION CODE BLOCK GENERATING METHOD AND APPARATUS AND OPTICAL STORAGE MEDIUM CONTAINING ERROR CORRECTION CODE BLOCK

(75) Inventors: Sung-hyu Han, Seoul (KR); Yoon-woo Lee, Gyeonggi-do (KR); Sang-hyun Ryu, Gyeonggi-do (KR); Young-im Ju, Seoul (KR); Sung-hee Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 590 days.

(21) Appl. No.: 10/335,859

(22) Filed: Jan. 3, 2003

(65) Prior Publication Data

US 2003/0126537 A1    Jul. 3, 2003

(30) Foreign Application Priority Data

Jan. 3, 2002    (KR) .................................. 2002-321

(51) Int. Cl.
G11C 29/00    (2006.01)
H03M 13/00    (2006.01)

(52) U.S. Cl. ...................... 714/770; 714/766

(58) Field of Classification Search ............... 714/770, 714/766
See application file for complete search history.

(56) References Cited

U.S. PATENT DOCUMENTS 6,718,510 B2 * 4/2004 Kojima ....................... 714/784
6,910,174 B2 * 6/2005 Keeler ........................ 714/769

FOREIGN PATENT DOCUMENTS

JP    2000-323996    11/2000

* cited by examiner

*Primary Examiner*—Joseph D. Torres
(74) *Attorney, Agent, or Firm*—Stein, McEwen & Bui, LLP

(57) ABSTRACT

An apparatus, method, and an optical storage medium to generate an error correction block include a data block generation unit processing digital data on a byte-by-byte basis and arranging the processed digital data from $0^{th}$ to $(N-1)^{th}$ columns and from $0^{th}$ to $(M-1)^{th}$ rows to form (M×N) data blocks. A matrix block generation unit arranges the (M×N) data blocks in K rows according to a data transmission sequence to form a matrix block. A first codeword generation unit adds a first error correction check word of 2×K bytes to each of N columns to form a first codeword of ((K×M)+2×K) bytes. A second codeword generation unit adds a second error correction check word of P bytes to each of ((K×M)+2×K) rows to form a second codeword of (N+P) bytes.

27 Claims, 5 Drawing Sheets

ERROR CORRECTION CODE BLOCK GENERATING METHOD AND APPARATUS AND OPTICAL STORAGE MEDIUM CONTAINING ERROR CORRECTION CODE BLOCK

CROSS-REFERENCE TO RELATED APPLICATIONS

This application claims the benefit of Korean Application No. 2002-321, filed Jan. 3, 2002, in the Korean Intellectual Property Office, the disclosure of which is incorporated herein by reference.

BACKGROUND OF THE INVENTION

1. Field of the Invention

The present invention relates to a method to generate an error correction code (ECC) block to record and/or transmit digital data, and more particularly, to an ECC block generating apparatus and method applicable to a small-sized optical storage medium.

2. Description of the Related Art

FIG. 1 shows a configuration of an ECC block of a general digital versatile disc (DVD). In the general DVD, one data recording unit includes 2064 bytes, including 2048 bytes for data and overhead, 16 bytes for additional information such as sector identification numbers, and error detection words. The data recording unit of 2064 bytes includes 12-byte rows, each containing 172 bytes (column). A block of 182×208 bytes, includes more than 16 rows for adding parity (PI and PO) than one data block of 12×172 bytes, wherein each of the 208 rows including 10 bytes or more is called an "ECC block."

The 2064 bytes are assigned to a sector of the Reed-Solomon (RS) ECC block where 16 sectors are sequentially stored in a predetermined region.

FIG. 2 shows a format of the RS ECC block applied when the data is written to the DVD. In the format of the RS ECC block, 16 bytes of the PO parity shown in FIG. 1 are added and distributed below each of the 16 sectors in one byte portions, which is expressed as ((12+1)×(172+10))×16).

When one ECC block having the format of FIG. 2 is written to an optical storage medium, the data of the ECC block is converted to a code of a length of about 82.6 mm.

A small form factor is a type of optical disc smaller than the DVD. The small form factor has a much smaller innermost circumference of about 50 mm than the DVD having an inner-most circumference of about 150.7 mm. Accordingly, when one ECC block having the above-described format is applied to a small optical storage medium, such as the small form factor, the code length extends greatly beyond the inner-most circumference limit of the small medium. Because the small form factor has a disc surface coating thickness of almost equal to zero, a probability of error occurring is higher than in the general DVD. Therefore, if the DVD error correction code is applied to the small form factor, error occurrence is expected to increase more compared to the DVD.

SUMMARY OF THE INVENTION

Additional aspects and advantages of the invention will be set forth in part in the description which follows and, in part, will be obvious from the description, or may be learned by practice of the invention.

Accordingly, according to an aspect of the present invention, there is provided an error correction code (ECC) block generating method and apparatus with improved error correction capability for a new standard, small optical storage medium, such as a small form factor, and an optical storage medium including the ECC block.

According to an aspect of the present invention there is provided a method to generate an error correction code block, including processing digital data on a byte-by-byte basis and arranging the processed digital data from $0^{th}$ to $(N-1)^{th}$ columns and from $0^{th}$ to $(M-1))^{th}$ rows to form (M×N) data blocks; arranging the (M×N) data blocks in K rows according to a data transmission sequence to form a matrix block; adding a first error correction check word of 2×K bytes to each of N columns, each including (K×M) bytes, to form a first codeword of ((K×M)+2×K) bytes; and adding a second error correction check word of P bytes to each of ((K×M)+2×K) rows, each including N bytes, to form a second codeword of (N+P) bytes.

According to another aspect of the present invention, there is provided a method to generate an error correction code block in a suitable write format of an optical storage medium, the method including processing digital data on a byte-by-byte basis and arranging the processed digital data from $0^{th}$ to $(N-1)^{th}$ columns and from $0^{th}$ to $(M-1)^{th}$ rows to form (M×N) data blocks; arranging the (M×N) data blocks in K rows according to a data transmission sequence to form a matrix block; adding a first error correction check word of 2×K bytes to each of N columns, each including (K×M) bytes, to form a first codeword of ((K×M)+2×K) bytes; adding a second error correction check word of P bytes to each of ((K×M)+2×K) rows, each of which contains N bytes, to form a second codeword of (N+P) bytes; separating two bytes from the first error correction check word of 233 K bytes in each of the columns; and adding the separated two bytes after each of the (K×M) rows, to form a write block format of K×(M+2)×(N+P).

According to an aspect of the present invention, there is provided an optical storage medium containing an error correction code block including processing digital data on a byte-by-byte basis and arranging the processed digital data from $0^{th}$ to $(N-1)^{th}$ columns and from $0^{th}$ to $(M-1)^{th}$ rows to form (M×N) data blocks; arranging the (M×N) data blocks in K rows according to a data transmission sequence to form a matrix block; adding a first error correction check word of 2×K bytes to each of N columns, each including (K×M) bytes, to form a first codeword of (K×M)+2×K bytes; adding a second error correction check word of P bytes to each of ((K×M)+2×K) rows, each of which contains N bytes, to form a second codeword of (N+P) bytes; separating two bytes from the first error correction check word of 2×K bytes in each of the columns; and adding the separated two bytes after each of the (K×M) rows, to form a write block format of K×(M+2)×(N+P).

According to an aspect of the present invention, there is provided an apparatus to generate an error correction block, the apparatus including a data block generation unit processing digital data on a byte-by-byte basis and arranging the processed digital data from $0^{th}$ to $(N-1)^{th}$ columns and from $0^{th}$ to $(M-1)^{th}$ rows to form (M×N) data blocks; a matrix block generation unit arranging the (M×N) data blocks in K rows according to a data transmission sequence to form a matrix block; a first codeword generation unit adding a first error correction check word of 2×K bytes to each of N columns, each including (K×M) bytes, to form a first codeword of ((K×M)+2×K) bytes; and a second codeword generation unit adding a second error correction check word of P bytes to each of ((K×M)+2×K) rows, each including N bytes, to form a second codeword of (N+P) bytes.

According to an aspect of the present invention, there is provided an apparatus to generate an error correction code block in a suitable write format of an optical storage medium, the apparatus including a data block generation unit processing digital data on a byte-by-byte basis and arranging the processed digital data from $0^{th}$ to $(N-1)^{th}$ columns and from $0^{th}$ to $(M-1)^{th}$ rows to form (M×N) data blocks; a matrix block generation unit arranging the (M×N) data blocks in K rows according to a data transmission sequence to form a matrix block; a first codeword generation unit adding a first error correction check word of 2×K bytes to each of N columns, each including (K×M) bytes, to form a first codeword of ((K×M)+2×K) bytes; a second codeword generation unit adding a second error correction check word of P bytes to each of ((K×M)+2×K) rows, each including N bytes, to form a second codeword of (N+P) bytes; and a write format generation unit separating two bytes from the first error correction check word of 2×K bytes in each of the columns and adding the separated two bytes after each of the (K×M) rows, to form a write block format of K×(M+2)× (N+P).

According to an aspect of the present invention, there is provided a method to generate an error correction code (ECC) block, including: processing digital data on a byte-by-byte basis and arranging the processed digital data from $0^{th}$ to $(N-1)^{th}$ columns and from $0^{th}$ to $(M-1)^{th}$ rows to form (M×N) data blocks; arranging the (M×N) data blocks in K rows according to a data transmission sequence to form a matrix block; adding a first error correction check word of 2×K bytes to each of N columns to form a first codeword of ((K×M)+2×K) bytes; and adding a second error correction check word of P bytes to each of ((K×M)+2×K) rows to form a second codeword of (N+P) bytes, wherein the ECC block includes a length smaller than an inner-most circumference of a small optical storage medium to improve error correction capability when data is read.

BRIEF DESCRIPTION OF THE DRAWINGS

These and other aspects and/or advantages of the invention will become apparent and more readily appreciated from the following description of the preferred embodiments, taken in conjunction with the accompanying drawings of which.

Figure 1:
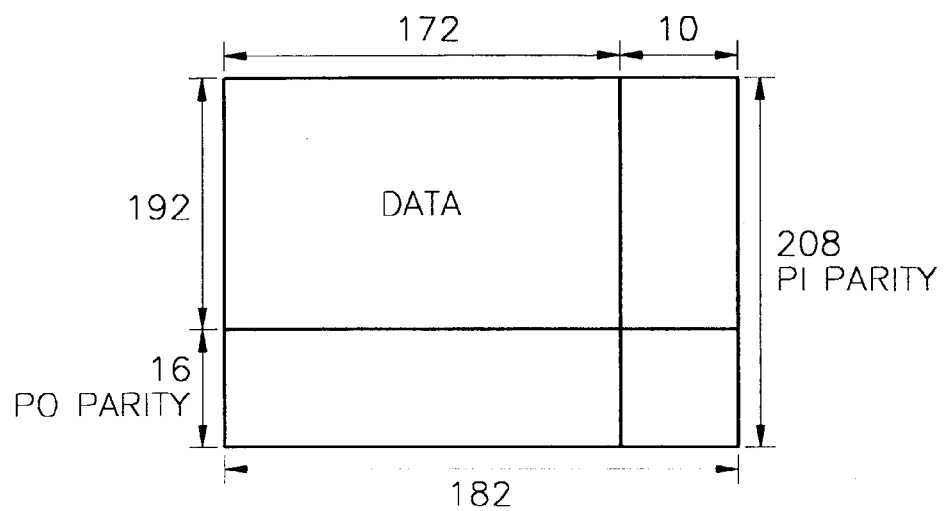
FIG. 1 shows a configuration of an error correction code (ECC) block of a general digital versatile disc (DVD)
Figure 2:
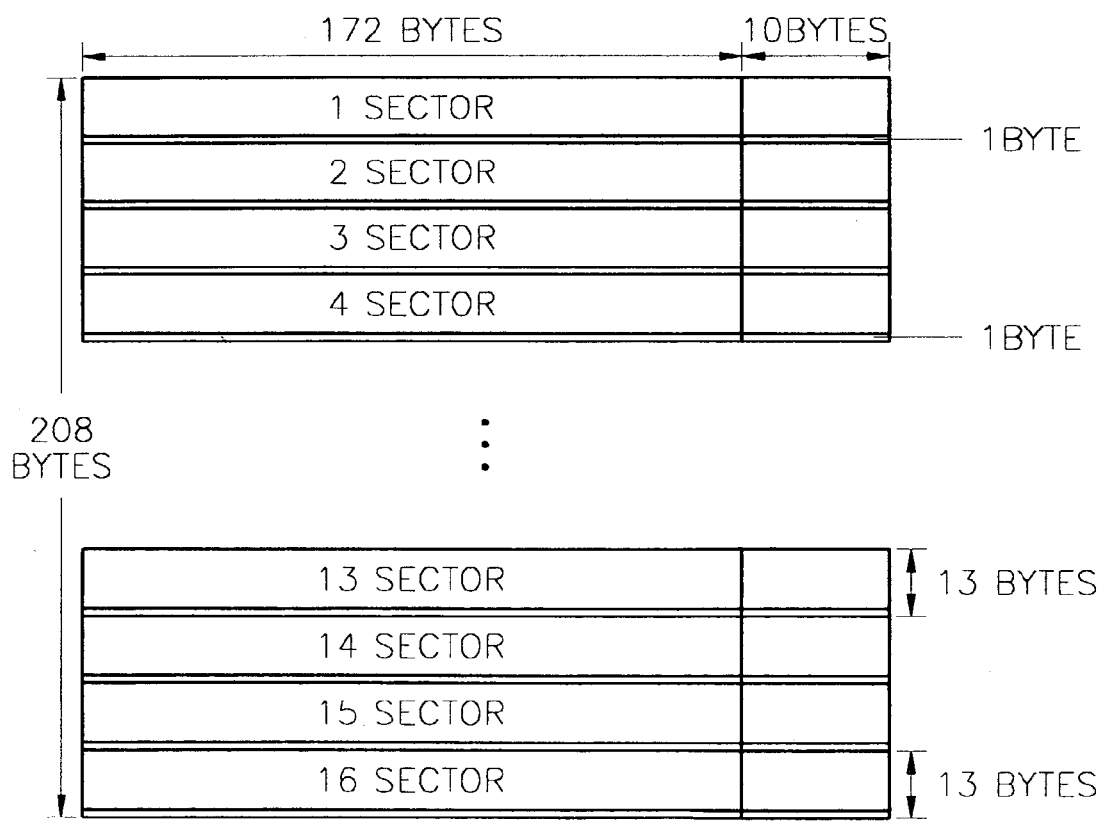
FIG. 2 shows a format of a Reed-Solomon (RS) ECC block of a DVD.

DETAILED DESCRIPTION OF THE
PREFERRED EMBODIMENTS

Reference will now be made in detail to the present preferred embodiments of the present invention, examples of which are illustrated in the accompanying drawings, wherein like reference numerals refer to like elements throughout.

An error correction code (ECC) block generating method, according to an aspect of the present invention, will be described with reference to FIG. 1, which shows an ECC block generating apparatus, according to an aspect of the present invention. Initially, a (M×N) data block generation unit 300 generates an (M×N) data block of 2064 bytes, containing 2048 bytes of user data and 16 bytes of additional information. Data is processed on a byte-by-byte basis and sequentially arranged from $0^{th}$ to $(N-1)^{th}$ columns. Next, N-byte columns where the data is arranged are arranged from $0^{th}$ to $(M-1)^{th}$ rows to generate the data block.

A K×(M×N) matrix block generation unit 310 generates a matrix block, which is a stack of K(M×N) blocks where (M×N) blocks generated by the (M×N) data block generation unit 300 are arranged in K rows according to a data transmission sequence.

A first codeword generation unit 320 adds a first error correction check word of 2K bytes to each column of (K×M) bytes of the matrix block. As a result, each of N data columns has a codeword of K×(M+2) bytes. The first error correction check word is a parity word (PO) obtained by applying a predetermined operational function h1 to (K×M) data, M1, M2, . . . , M(K×M), in each column and, thus, expressed as h1(M1, M2, . . . , M(K×M)). Here, a length of the first error correction check word, i.e., the parity (PO), is equal to 2×K.

A second codeword generation unit 330 adds a second error correction check word of P bytes to each row of N bytes of the matrix block to generate a second codeword of (N+P) in each of the K×(M+2) rows. The second error correction check work is a parity word (PI) obtained by applying a predetermined operational function h2 to N data, N1, N2, . . . , N(n), in each row and thus expressed as h2(N1, N2, . . . , N(n)). Here, a length of the second error correction check word, i.e., the parity (PI), is equal to a predetermined number P.

As a result of passing data through the second codeword generation unit 330, an error correction code block (K×M+ 2K)×(N+P) is obtained. Although not illustrated in FIG. 3, to convert a result from the second codeword generation unit 330 to be writeable to an optical storage medium, a write format generation unit which generates a format of (K×(M+ 2)×(N+P)) by inserting two bytes of the first error correction check word below each row of M bytes in every column, may be further incorporated.

Figure 3:
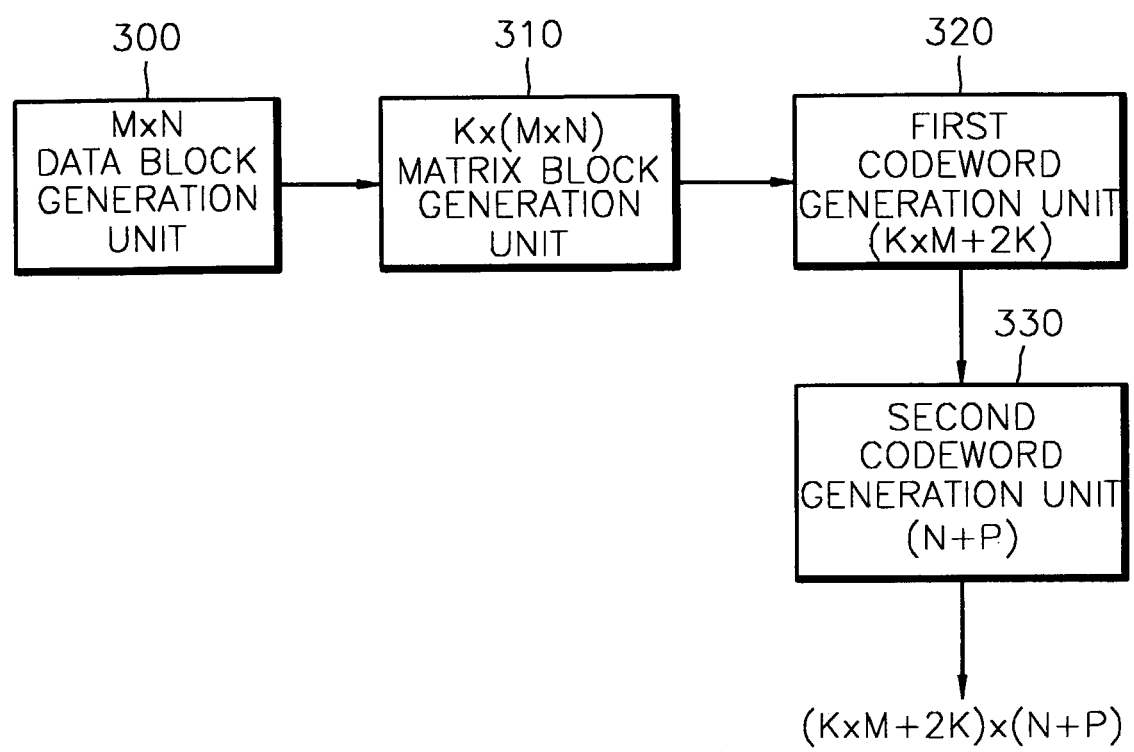
FIG. 3 is a block diagram of an ECC block generating apparatus, according to an aspect of the present invention.

In the above-description with reference to FIG. 3, the parameters K, M, N, and P in the ECC code block are adjustable for a suitable ECC block length to be fit to an inner-most circumference of a smaller optical storage medium, such as a small form factor, than a general DVD. In an exemplary aspect of the present invention, the inner-most circumference of the small form factor may be about 50 mm or less, which is about one third of the inner-most circumference of the general DVD. The parameters K, M, N, and P in the ECC code block are adjustable such that a code length is not greater than the inner-most circumference of the small form factor. When the parameters K, M, N, and P are determined, user data capacity for one section needs to be considered to be 2048 bytes for easy digital processing. Based on the above considerations, for example, a (K×(M+ 2)×(N+P)) ECC block where M=12, N=172, K=8, and P=10, or M=24, N=86, K=8, and P=10, i.e., a (8×(12+2)×(172+ 10)) ECC block or a (8×(24+2)×(86+10)) ECC block may be suggested.

Figure 4A:
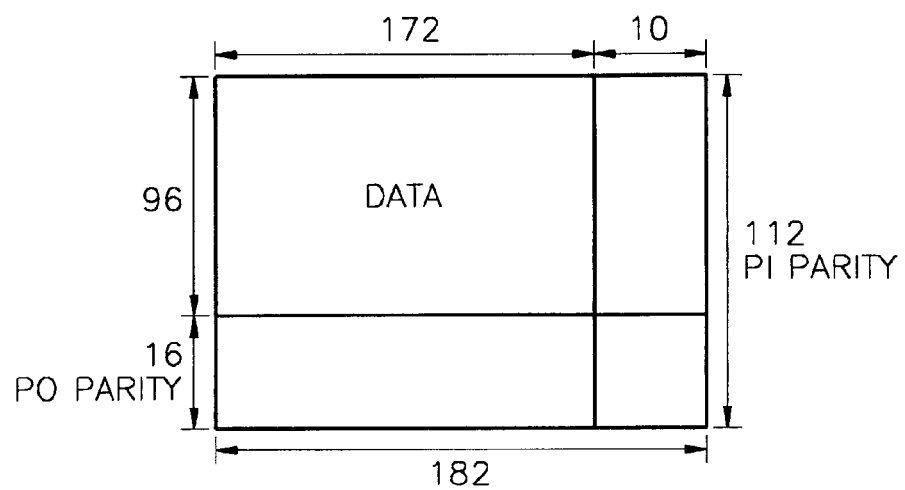
FIGS. 4A and 4B show an aspect of an ECC block format, according to the present invention.
Figure 4B:
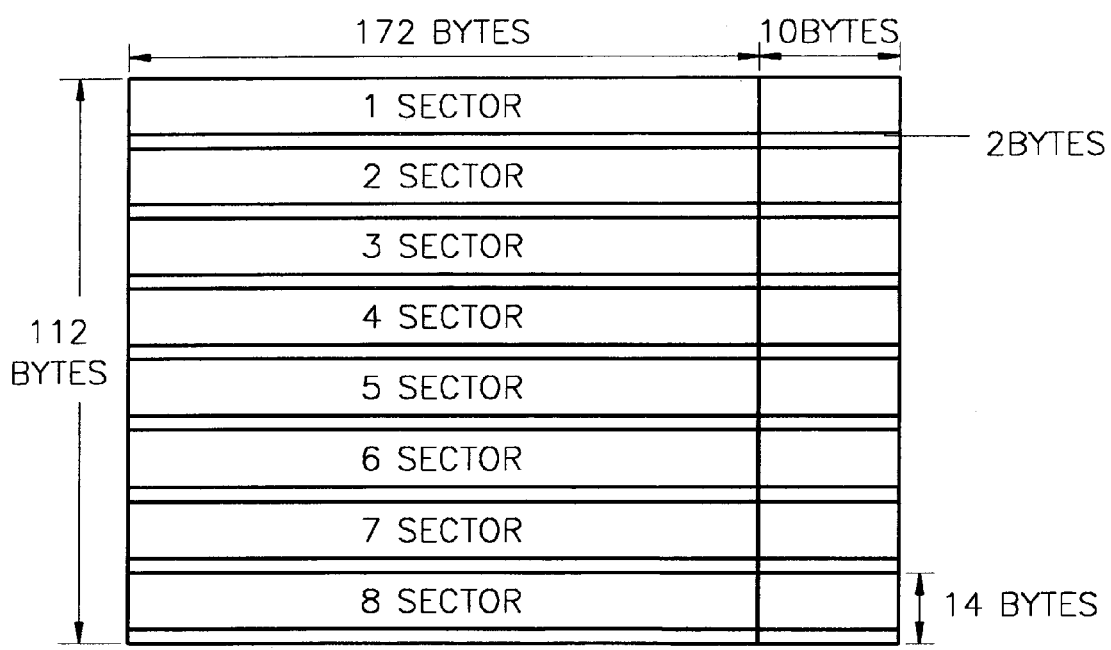

FIGS. 4A and 4B show an aspect of an ECC block format according to the present invention. The ECC block of FIG. 4A is a ((K×M+K×2)×(N+P)) ECC block where M=12, N=172, K=8, and P=10, which is constructed according to the method illustrated in FIG. 3. The ECC block format of FIG. 4A is shown before being processed by the write format generation unit described above.

FIG. 4B shows a format of the ECC block of FIG. 4A after being converted to be written to the optical storage medium, i.e., after being processed by the write format generation unit. The ECC block of FIG. 4B processed through the write format generation unit is obtained by separating two bytes from the parity word (PO) of 16 bytes added to each column and inserting the separated two bytes after each row of 12 bytes.

Figure 5A:
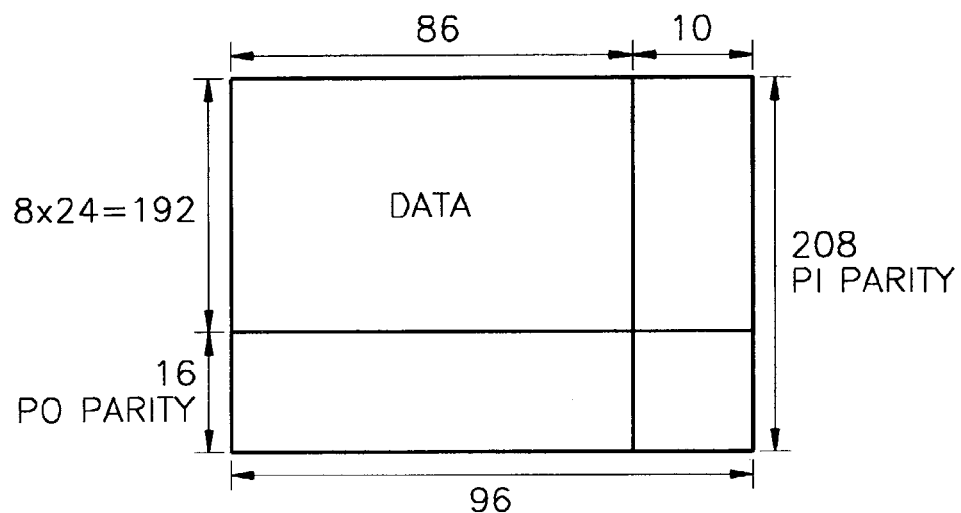
FIGS. 5A and 5B show another aspect of the ECC block format, according to the present invention.
Figure 5B:
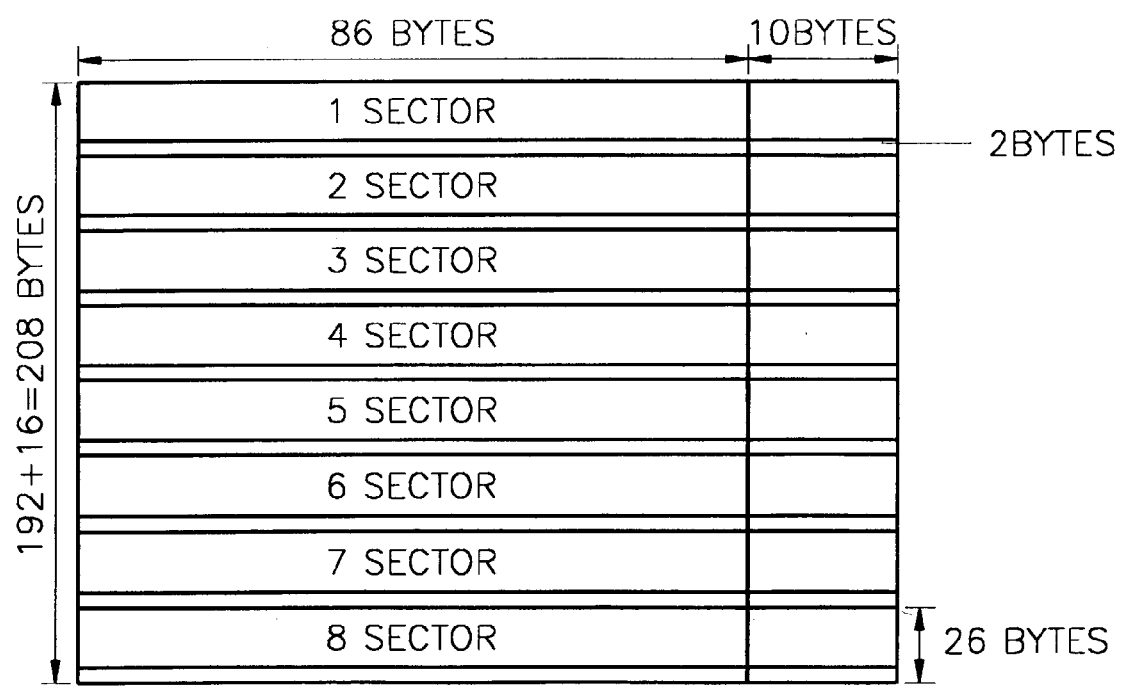

FIGS. 5A and 5B show another format of the ECC block, according to an aspect of the present invention. The ECC block of FIG. 5A is the ((K×M+K×2)×(N+P)) ECC block where M=24, N=86, K=8, and P=10, before being processed by the write format generation unit described above.

FIG. 5B shows a format of the ECC block of FIG. 5A after being converted to be written to the optical storage medium, i.e., after being processed by the write format generation unit. The ECC block of FIG. 5B processed through the write format generation unit is obtained by separating two bytes from the parity word (PO) of 16 bytes added to each column and by inserting the separated two bytes after each row of 24 bytes. The ECC block generated using the above-described method and apparatus is written to the small optical storage medium, such as the small form factor, after being appropriately converted through the above-described write formation generation unit.

According to an aspect of the present invention, the ECC block having less sectors than conventional DVDs but an equal storage capacity for the parity word (or error correction check work) is formed. Therefore, the ECC block, according to an aspect of the present invention, provides a code length smaller than the inner-most circumference of the small optical storage medium and improved error correction capability, compared to the conventional DVDs.

Figure 6:
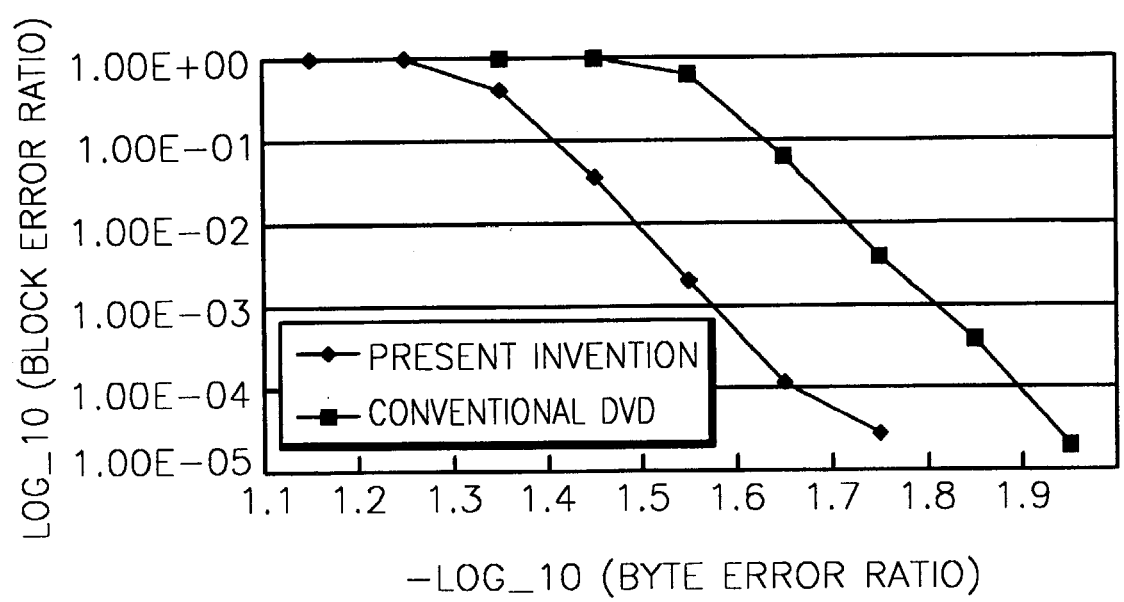
FIG. 6 is a graph of a comparative error correction efficiency between the ECC block, according to an aspect of the present invention, and a conventional ECC block of the general DVD.

FIG. 6 is a graph of a comparative error correction efficiency between the ECC block of FIG. 4B, according to an aspect of the present invention, and a conventional ECC block for the general DVD. As is apparent from FIG. 6, when the ECC block, according to an aspect of the present invention, is applied, the error correction capability is greatly improved.

As described above, an ECC block, according to an aspect of the present invention, provides an ECC length smaller than an inner-most circumference of a small optical storage medium and improved error correction capability when data is read.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A method to generate an error correction code (ECC) block, comprising:
   processing digital data on a byte-by-byte basis and arranging processed digital data from $0^{th}$ to $(N-1)^{th}$ columns and from $0^{th}$ to $(M-1)^{th}$ rows to form (M×N) data blocks;
   arranging the (M×N) data blocks in K rows according to a data transmission sequence to form a matrix block;
   adding a first error correction check word of 2×K bytes to each of N columns, each comprising (K×M) bytes, to form a first codeword of ((K×M)+2×K) bytes; and
   adding a second error correction check word of P bytes to each of ((K×M)+2×K) rows, each comprising N bytes, to form a second codeword of (N+P) bytes so as to obtain an error correction code (ECC) block suitable for digital data recording on an optical storage medium,
   wherein parameters K, M, N, and P in the ECC block are adjustable such a suitable ECC block length is not greater than an inner-most circumference of the optical storage medium.

2. The method of claim 1, wherein the first error correction check word is obtained by applying a predetermined operational function h1 to the data in each of the columns, which is expressed as h1(M1, M2, . . . , M(K×M)), where M1, M2, . . . , M(K×M) denote the data in each of the columns, and the first error correction check word has a length of 2×K bytes.

3. The method of claim 1, wherein the second error correction check work is obtained by applying a predetermined operational function h2 to the data in each of the rows, which is expressed as h2(N1, N2, . . . , N(n)), where N1, N2, . . . , N(n) denote the data in each of the rows, and the second error correction check word has a length of P bytes.

4. The method of claim 1, wherein in the (M×N) data blocks, M is 12 bytes, and N is 172 bytes.

5. The method of claim 1, wherein K is equal to 8.

6. The method of claim 1, wherein in the (M×N) data blocks, M is 24 bytes, and N is 86 bytes.

7. The method of claim 1, wherein M=12, N=172, K=8, and P=10.

8. The method of claim 1, wherein M=24, N=86, K=8, and P=10.

9. The method of claim 1, wherein the (M×N) data blocks comprise 2064 bytes having user data of 2048 bytes and predetermined additional information.

10. An apparatus to generate an error code correction (ECC) block, the apparatus comprising:
    a data block generation unit processing digital data on a byte-by-byte basis and arranging processed digital data from $0^{th}$ to $(N-1)^{th}$ columns and from $0^{th}$ to $(M-1)^{th}$ rows to form (M×N) data blocks;
    a matrix block generation unit arranging the (M×N) data blocks in K rows according to a data transmission sequence to form a matrix block;
    a first codeword generation unit adding a first error correction check word of 2×K bytes to each of N columns, each column comprising (K×M) bytes, to form a first codeword of ((K×M)+2×K) bytes; and
    a second codeword generation unit adding a second error correction check word of P bytes to each of ((K×M)+2×K) rows, each row comprising N bytes, to form a second codeword of (N+P) bytes so as to obtain an error correction code (ECC) block suitable for digital data recording on an optical storage medium;
    wherein parameters K, M, N, and P in the ECC block are adjustable such a suitable ECC block length is not greater than an inner-most circumference of the optical storage medium.

11. The apparatus of claim 10, wherein the first error correction check word is obtained by applying a predetermined operational function h1 to the data in each of the columns, which is expressed as h1(M1, M2, . . . , M(K×M)), where M1, M2, . . . , M(K×M) denote the data in each of the columns, and the first error correction check word has a length of 2×K bytes.

12. The apparatus of claim 10, wherein the second error correction check word is obtained by applying a predetermined operational function h2 to the data in each of the rows, which is expressed as h2(N1, N2, . . . , N(n)), where N1, N2, . . . , N(n) denote the data in each of the rows, and the second error correction check word has a length of P bytes.

13. The apparatus of claim 10, wherein in the (M×N) data blocks, M is 12 bytes, and N is 172 bytes.

14. The apparatus of claim 10, wherein K is equal to 8.

15. The apparatus of claim 10, wherein in the (M×N) data blocks, M is 24 bytes, and N is 86 bytes.

16. The apparatus of claim 10, wherein M=12, N=172, K=8, and P=10.

17. The apparatus of claim 10, wherein M=24, N=86, K=8, and P=10.

18. The apparatus of claim 10, wherein the (M×N) data blocks comprise 2064 bytes having user data of 2048 bytes and predetermined additional information.

19. A method to generate an error correction code (ECC) block for digital data recording on an optical storage medium, comprising:
   processing digital data on a byte-by-byte basis and arranging the processed digital data from $0^{th}$ to $(N-1)^{th}$ columns and from $0^{th}$ to (M−1)th rows to form (M×N) data blocks;
   arranging the (M×N) data blocks in K rows according to a data transmission sequence to form a matrix block;
   adding a first error correction check word of 2×K bytes to each of N columns to form a first codeword of ((K× M)+2×K) bytes; and
   adding a second error correction check word of P bytes to each of ((K×M)+2×K) rows to form a second codeword of (N+P) bytes, so as to obtain an error correction code (ECC) block suitable for digital data recording on an optical storage medium,
   wherein parameters K, M, N, and P in the ECC block are adjustable such a suitable ECC block length is not greater than an inner-most circumference of the optical storage medium to improve error correction capability when data is read therefrom.

20. The method of claim 19, wherein the first error correction check word is obtained by applying a predetermined operational function h1 to the data in each of the columns, which is expressed as h1(M1, M2, . . . , M(K×M)), where M1, M2, . . . , M(K×M) denote the data in each of the columns, and the first error correction check word has a length of 2×K bytes.

21. The method of claim 19, wherein the second error correction check work is obtained by applying a predetermined operational function h2 to the data in each of the rows, which is expressed as h2(N1, N2, . . . , N(n)), where N1, N2, . . . , N(n) denote the data in each of the rows, and the second error correction check word has a length of P bytes.

22. The method of claim 19, wherein in the (M×N) data blocks, M is 12 bytes, and N is 172 bytes.

23. The method of claim 19, wherein K is equal to 8.

24. The method of claim 19, wherein in the (M×N) data blocks, M is 24 bytes, and N is 86 bytes.

25. The method of claim 19, wherein M=12, N=172, K=8, and P=10.

26. The method of claim 19, wherein M=24, N=86, K=8, and P=10.

27. The method of claim 19, wherein the (M×N) data blocks comprise 2064 bytes having user data of 2048 bytes and predetermined additional information.

* * * * *

UNITED STATES PATENT AND TRADEMARK OFFICE
CERTIFICATE OF CORRECTION

PATENT NO. : 7,174,496 B2  Page 1 of 1
APPLICATION NO. : 10/335859
DATED : February 6, 2007
INVENTOR(S) : Sung-hyu Han et al.

It is certified that error appears in the above-identified patent and that said Letters Patent is hereby corrected as shown below:

Column 7, line 28, change
"(M-1)th" to -- $(M-1)^{th}$ --

Signed and Sealed this

Fifteenth Day of May, 2007

JON W. DUDAS
*Director of the United States Patent and Trademark Office*